United States Patent
Kim et al.

(10) Patent No.: US 8,680,518 B2
(45) Date of Patent: Mar. 25, 2014

(54) ORGANIC LIGHT-EMITTING DIODE DISPLAY DEVICE HAVING DEEP AND SKY BLUE SUB-PIXELS

(71) Applicant: LG Display Co., Ltd., Seoul (KR)

(72) Inventors: Yong-Chul Kim, Gyeonggi-do (KR); Juhn-Suk Yoo, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/666,065

(22) Filed: Nov. 1, 2012

(65) Prior Publication Data

US 2013/0105778 A1   May 2, 2013

(30) Foreign Application Priority Data

Nov. 1, 2011   (KR) .................. 10-2011-0112725

(51) Int. Cl.
| | |
|---|---|
| *H01L 29/08* | (2006.01) |
| *H01L 35/24* | (2006.01) |
| *H01L 51/00* | (2006.01) |
| *H01L 29/04* | (2006.01) |
| *H01L 29/10* | (2006.01) |
| *H01L 31/036* | (2006.01) |
| *H01L 31/0376* | (2006.01) |
| *H01L 31/20* | (2006.01) |
| *H01L 29/15* | (2006.01) |
| *H01L 29/20* | (2006.01) |
| *H01L 33/00* | (2010.01) |

(52) U.S. Cl.
USPC .................. 257/40; 257/59; 257/72; 257/89; 257/E51.022

(58) Field of Classification Search
USPC ............................ 257/40, 59, 72, 89, E51.022
See application file for complete search history.

(56) References Cited

U.S. PATENT DOCUMENTS

| | | | | |
|---|---|---|---|---|
| 7,550,797 | B2 * | 6/2009 | Suzuki .......................... | 257/291 |
| 7,567,030 | B2 * | 7/2009 | Wano ............................ | 313/504 |
| 7,791,565 | B2 * | 9/2010 | Fish et al. ..................... | 345/76 |
| 7,795,629 | B2 * | 9/2010 | Watanabe et al. .............. | 257/89 |
| 7,990,498 | B2 * | 8/2011 | Hong ............................ | 349/106 |
| 8,334,952 | B2 * | 12/2012 | Wu et al. ...................... | 349/112 |
| 8,362,683 | B2 * | 1/2013 | Tamura et al. ................ | 313/500 |
| 8,384,858 | B2 * | 2/2013 | Ono et al. ..................... | 349/106 |
| 8,427,047 | B2 * | 4/2013 | Choi et al. .................... | 313/504 |
| 8,471,275 | B2 * | 6/2013 | Lee et al. ...................... | 257/89 |
| 8,478,081 | B2 * | 7/2013 | Paillet et al. .................. | 382/312 |
| 2005/0146266 | A1 * | 7/2005 | Kuma et al. ................... | 313/506 |
| 2006/0187384 | A1 * | 8/2006 | Hisatake ....................... | 349/113 |
| 2009/0242911 | A1 * | 10/2009 | Ishihara et al. ................ | 257/89 |
| 2010/0258893 | A1 * | 10/2010 | Sawada ......................... | 257/440 |

(Continued)

*Primary Examiner* — Ida M Soward

(74) *Attorney, Agent, or Firm* — Morgan, Lewis & Bockius LLP

(57) ABSTRACT

Provided is an organic light-emitting diode (OLED) display device having sub-pixels with four colors. When a B1 sub-pixel that represents deep blue and a B2 sub-pixel that represents sky blue are formed, by using a high efficiency blue organic material to form the same emission material layers in both the B1 and B2 sub-pixels such that a microcavity effect is implemented only in the B2 sub-pixel and a sky blue peak is extracted from the high efficiency blue organic material of the B2 sub-pixel, the emission material layer of the B2 sub-pixel represents sky blue. Therefore, a process of depositing emission material layers is simplified, which leads to a short process time and a reduction of the cost of materials, resulting in improvement in process efficiency of the OLED display device.

6 Claims, 7 Drawing Sheets

(56) References Cited

U.S. PATENT DOCUMENTS

| | | | |
|---|---|---|---|
| 2011/0025723 A1* | 2/2011 | Kim | 345/690 |
| 2011/0198629 A1* | 8/2011 | Lee et al. | 257/89 |
| 2011/0248256 A1* | 10/2011 | Cok et al. | 257/40 |
| 2011/0309389 A1* | 12/2011 | Yu et al. | 257/89 |
| 2012/0007496 A1* | 1/2012 | Maruyama et al. | 313/504 |
| 2012/0038267 A1* | 2/2012 | Hanamura et al. | 313/504 |
| 2012/0049726 A1* | 3/2012 | Yoo et al. | 313/504 |
| 2012/0064651 A1* | 3/2012 | Shiozaki et al. | 438/35 |
| 2012/0105517 A1* | 5/2012 | Yang et al. | 345/694 |
| 2013/0016296 A1* | 1/2013 | Fujita et al. | 349/42 |
| 2013/0154478 A1* | 6/2013 | Ohe et al. | 315/85 |

* cited by examiner

ORGANIC LIGHT-EMITTING DIODE DISPLAY DEVICE HAVING DEEP AND SKY BLUE SUB-PIXELS

The present application claims the priority benefit of Korean Patent Application No. 10-2011-0112725 filed in the Republic of Korea on Nov. 1, 2011, which is hereby incorporated by reference in their entirety.

BACKGROUND

1. Field of the Disclosure

The present disclosure relates to an organic light-emitting diode (OLED) display device, and more particularly, to an organic light-emitting diode (OLED) display device having sub-pixels with four colors.

2. Discussion of the Related Art

A cathode ray tube (CRT) has been widely used as a display device for a long time. However, lately, flat panel displays, such as a plasma display panel (PDP), a liquid crystal display (LCD), and an organic light-emitting diode (OLED) display device, have been developed as a display device with which can replace the CRT, and are widely used.

Among flat panel displays, the OLED display device which is a self-luminous device, can be manufactured as a light-weighted and slim product since it requires no backlight, unlike the LCD which is a non-emissive device.

Also, the OLED display device is excellent in view of a viewing angle and a contrast ratio, advantageous in view of consumption power, allows DC low voltage driving, and has a high response rate. In addition, since the internal material of the OLED display device is a solid, the OLED display device is resistant against external impacts, and has a wide range of usable temperature.

In particular, since the OLED display device can be manufactured through a simple process, manufacturing costs are lower than those of the LCD.

The OLED display device is a self-luminous device that emits light through organic light-emitting diodes, and the organic light-emitting diodes emit light through organic electro luminescence.

FIG. 1 is a band diagram of an OLED display device 10 that emits light through organic electro luminescence.

As shown in FIG. 1, the OLED display device 10 includes an anode electrode 21, a cathode electrode 25, and an organic light-emitting layer interposed between the anode electrode 21 and the cathode electrode 25. The organic light-emitting layer includes a hole transport layer (HTL) 33, an electron transport layer (ETL) 35, and an emission material layer (EML) 40 interposed between the HTL 33 and the ETL 35.

In order to improve luminous efficiency, a hole injection layer (HIL) 37 is interposed between the anode electrode 21 and the HTL 33, and an electron injection layer (EIL) 39 is interposed between the cathode electrode 25 and the ETL 35.

In the OLED display device 10, if positive (+) and negative (−) voltages are applied to the anode electrode 21 and the cathode electrode 25, respectively, the holes of the anode electrode 21 and the electrons of the cathode electrode 25 are transported to the emission material layer 40 to generate excitons, and when the excitons return to the ground state from the excited state, light is generated and emitted in the form of visible light by the emission material layer 40.

Meanwhile, lately, studies into a full color OLED display device are actively being conducted. The emission material layers 40 of a plurality of organic light-emitting layers represent red, green, and blue colors.

A full color OLED display device can control its color reproduction range and life span according to the kind of blue organic material.

If a blue emission material layer is made of a deep blue organic material, the deep blue organic material has an excellent color reproduction range, but has a shorter life span and lower luminous efficiency than a sky blue organic material.

Sky blue organic material is excellent in view of life span and luminous efficiency, compared to deep blue organic material, but has a relatively narrow color reproduction range.

Accordingly, in order to efficiently use a blue emission material layer, an OLED display device 10 with four color organic emission layers including a deep blue emission material layer and a sky blue emission material layer in a pixel, has been introduced.

Meanwhile, the OLED display device 10 with the four color organic emission layers has low process efficiency since the four color organic emission layers should be individually formed by vacuum thermal evaporation.

That is, in the OLED display device 10, the remaining components except for the anode and cathode electrodes 21 and 25, that is, organic emission layers, such as the HIL 37, the HTL 33, the emission material layer 40, the ETL 35, the EIL 39, etc., are formed generally through vacuum thermal evaporation.

Specifically, vacuum thermal evaporation for forming the emission material layer 40 is performed by placing an organic material with a desired color in a deposition source (not shown) having a discharge opening, heating the deposition source in a vacuum chamber (not shown) to evaporate the organic material, discharging the evaporated organic material through the discharge opening, and then depositing the discharged organic material on a substrate (not shown).

Vacuum thermal evaporation can form an emission material layer 40 with one color when it is once performed, and requires a long process time. Accordingly, manufacturing time of the OLED display device 10 increases as the number of vacuum thermal evaporation operations increases. Also, since various colors of organic materials are needed, the cost of materials increases and process efficiency is low.

SUMMARY OF THE INVENTION

Accordingly, the present invention is directed to an organic light-emitting diode (OLED) display device that substantially obviates one or more of the problems due to limitations and disadvantages of the related art.

An object of the present disclosure is to provide an OLED display device capable of ensuring a wide color reproduction range while significantly increasing life span and luminous efficiency.

Another object of the present disclosure is to provide an OLED display device capable of improving process efficiency.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, there is provided an organic light-emitting diode (OLED) display device in which a red sub-pixel, a green sub-pixel, a deep blue sub-pixel, and a sky blue sub-pixel form a pixel, including: an organic light-emitting layer in which the red sub-pixel includes a red light-emitting material layer, the green sub-pixel includes a green light-emitting material layer, and the deep blue sub-pixel and the sky blue sub-pixel include the same blue light-emitting material layers; and an organic light-emitting diode including a first electrode and a second electrode for each sub-pixel, wherein the first electrode of the sky blue sub-pixel includes a reflection layer, the second electrode of the sky blue sub-pixel is semi-transparent, and the sky blue sub-pixel represents sky blue through a microcavity effect.

The blue light-emitting material layer may have a deep blue peak and a light blue peak, and a sky blue peak may be extracted from the blue light-emitting material layer by the microcavity effect. The microcavity effect may be implemented due to the blue light-emitting material layers or peripheral layers of the sky blue sub-pixel having different thickness combinations from the red sub-pixel, the green sub-pixel, and the deep blue sub-pixel.

The peripheral layers may include a hole transport layer and a hole injection layer between the blue light-emitting material layer and the first electrode, and an electron transport layer and an electron injection layer between the blue light-emitting material layer and the second electrode.

In another aspect, there is provided an organic light-emitting diode (OLED) display device in which a red sub-pixel, a green sub-pixel, a deep blue sub-pixel, and a sky blue sub-pixel form a pixel, including: an organic light-emitting layer in which the red sub-pixel includes a red light-emitting material layer, the green sub-pixel includes a green light-emitting material layer, and the deep blue sub-pixel and the sky blue sub-pixel include the same blue light-emitting material layers; and an organic light-emitting diode including a first electrode and a second electrode for each sub-pixel, wherein the first electrodes of the deep blue sub-pixel and the sky blue sub-pixel include reflection layers, the second electrodes of the deep blue sub-pixel and the sky blue sub-pixel are semi-transparent, and the deep blue sub-pixel and the sky blue sub-pixel include different combinations of the thicknesses of the blue light-emitting material layers or peripheral layers so as to represent sky blue in the sky blue sub-pixel and deep blue in the deep blue sub-pixel by a microcavity effect.

The peripheral layers may include a hole transport layer and a hole injection layer between the blue light-emitting material layer and the first electrode, and an electron transport layer and an electron injection layer between the blue light-emitting material layer and the second electrode. The first electrodes of the red sub-pixel and the green sub-pixel may include reflection layers, and the second electrodes may be semi-transparent.

The deep blue sub-pixel or the sky blue sub-pixel may have two or three times the areas of the red sub-pixel and the green sub-pixels. The red sub-pixel and the green sub-pixel may be arranged in the left side of the deep blue sub-pixel and in the right side of the sky blue sub-pixel, and disposed in an up-down direction.

The red sub-pixel and the green sub-pixel may share the deep blue sub-pixel and the sky blue sub-pixel to form a plurality of pixels.

As described above, according to the present disclosure, when a B1 sub-pixel that represents deep blue and a B2 sub-pixel that represents sky blue are formed, by using a high efficiency blue organic material to form the same emission material layers in both the B1 and B2 sub-pixels such that a microcavity effect is implemented only in the B2 sub-pixel and a sky blue peak is extracted from the high efficiency blue organic material of the B2 sub-pixel, the emission material layer of the B2 sub-pixel can represent sky blue. Therefore, a process of depositing emission material layers is simplified, which leads to a short process time and a reduction of the cost of materials, resulting in improvement in process efficiency of the OLED display device.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments, examples of which are illustrated in the accompanying drawings.

Figure 1:
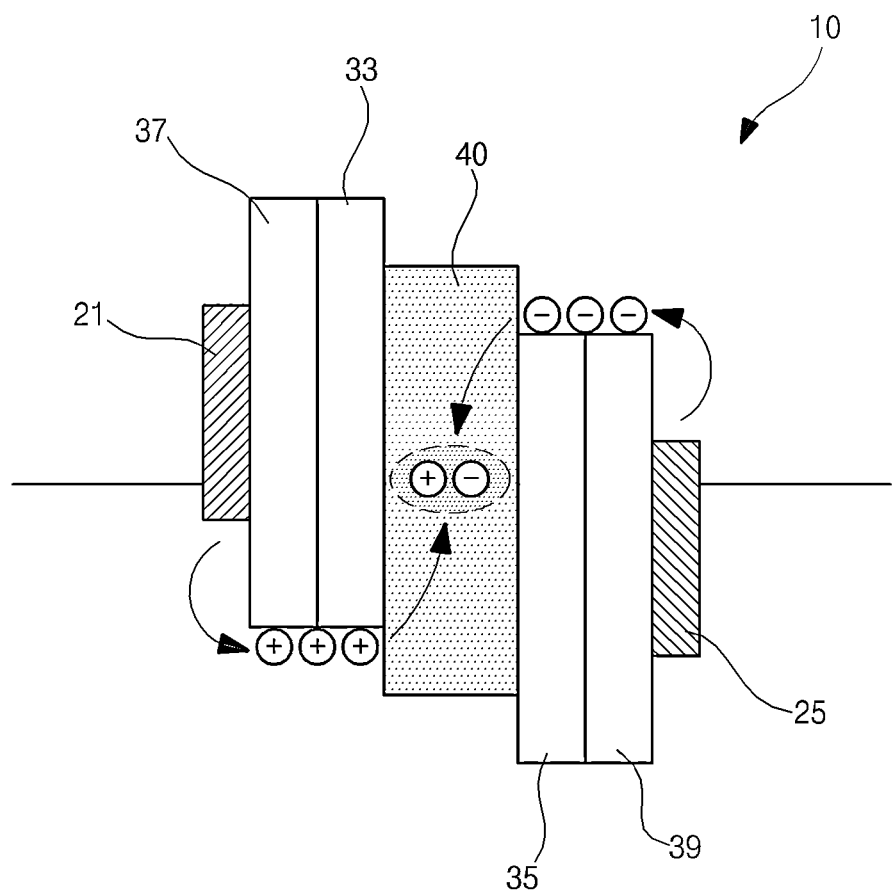
FIG. 1 is a band diagram of an organic light-emitting diode (OLED) display device that emits light through organic electro luminescence.
Figure 2:
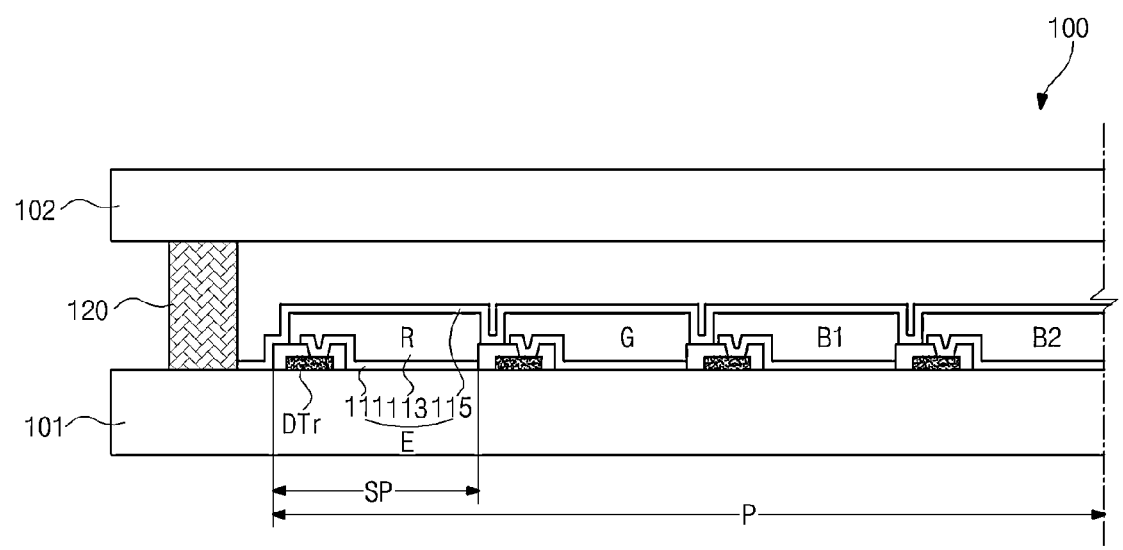
FIG. 2 is a cross-sectional view schematically illustrating an OLED display device according to an embodiment of the present invention.

FIG. 2 is a cross-sectional view schematically illustrating an organic light-emitting diode (OLED) display device 100 according to an embodiment of the present invention.

Generally, an OLED display device is classified into a top emission type and a bottom emission type according to the direction in which emitted light is transmitted. In the following description, the OLED display device 100 is a top emission type.

As shown in FIG. 2, the OLED display device 100 includes a first substrate 101 and a second substrate 102 that faces the first substrate 101. The first and second substrates 101 and 102 are spaced apart from each other, and the edge portions of the first and second substrates 101 and 102 are encapsulated and bonded by seal patterns 120.

In more detail, on the first substrate 101, a switching thin film transistor (not shown), a driving thin film transistor DTr, a storage capacitor (not shown), and an organic light-emitting diode E are formed for each sub-pixel SP. The organic light-emitting diode E includes a first electrode 111 connected to the driving thin film transistor DTr, an organic emission layer 113 disposed on the first electrode 111 to emit light with a specific color, and a second electrode 115 disposed on the organic emission layer 113.

Although not shown in FIG. 2, the driving thin film transistor DTr is configured with a gate electrode, a semiconductor layer, a source electrode, and a drain electrode.

The driving thin film transistor DTr may be a top gate type including a polysilicon semiconductor layer, or a bottom gate type including intrinsic amorphous silicon and impurity-doped amorphous silicon.

If the driving thin film transistor DTr is a top gate type, the semiconductor layer of the driving thin film transistor DTr is formed as a polysilicon layer. The center part of the semiconductor layer is an active area configuring a channel, both sides of the active area are source and drain areas doped with a high concentration of impurities, and a gate insulating film is formed on the semiconductor layer.

Also, on the gate insulating film, a gate electrode is formed in correspondence to the semiconductor layer, and source and drain electrodes are formed to contact the source and drain areas, respectively.

Also, in an area that substantially displays images on the driving thin film transistor DTr, the organic light-emitting diode E is configured, and the first electrode 111 of the organic light-emitting diode E is connected to the drain electrode of the driving thin film transistor DTr.

In this case, the first electrode 111 acts as an anode electrode, and the second electrode 115 acts as a cathode electrode.

The second electrode 115 has a double layer structure in which a transparent, conductive material is deposited with a thick thickness on a semi-transparent metal film formed by depositing a metal material with a thin thickness having a low work function.

Accordingly, the OLED display device 100 is driven as a top emission type in which light radiated from the organic emission layer 113 is emitted toward the second electrode 115.

The organic emission layer 113 may be a single layer made of a light-emitting material, or a multi-layer structure consisting of a hole injection layer, a hole transport layer, emission material layers (200a, 200b, 200c, and 200d of FIG. 3), an electron transport layer, and an electron injection layer in order to increase luminous efficiency.

The emission material layers (200a, 200b, 200c, and 200d of FIG. 3) of the organic emission layer 113 consist of red (R), green (G), deep blue (B1), and sky blue (B2) emission material layers for individual sub-pixels.

That is, in the OLED display device 100 according to the present embodiment, four sub-pixels including sub-pixels that emit red (R) and green (G) and sub-pixels that emit deep blue (B1) and sky blue (B2) configure a pixel P.

If predetermined voltages are applied to the first and second electrodes 111 and 115 according to a selected color signal, holes emitted from the first electrode 111 and electrons emitted from the second electrode 115 are transported to the organic emission layer 113 to generate excitons, and when the excitons return to the ground state from the excited state, light is generated and emitted in the form of visible light.

The emitted light is transmitted through the transparent second electrode 11 and emitted to the outside, so that the OLED display device 100 displays an image.

Accordingly, the OLED display device 100 can ensure a wide color reproduction range while significantly increasing life span and luminous efficiency. Also, the OLED display device 100 can improve process efficiency. This will be described in more detail, later.

Figure 3:
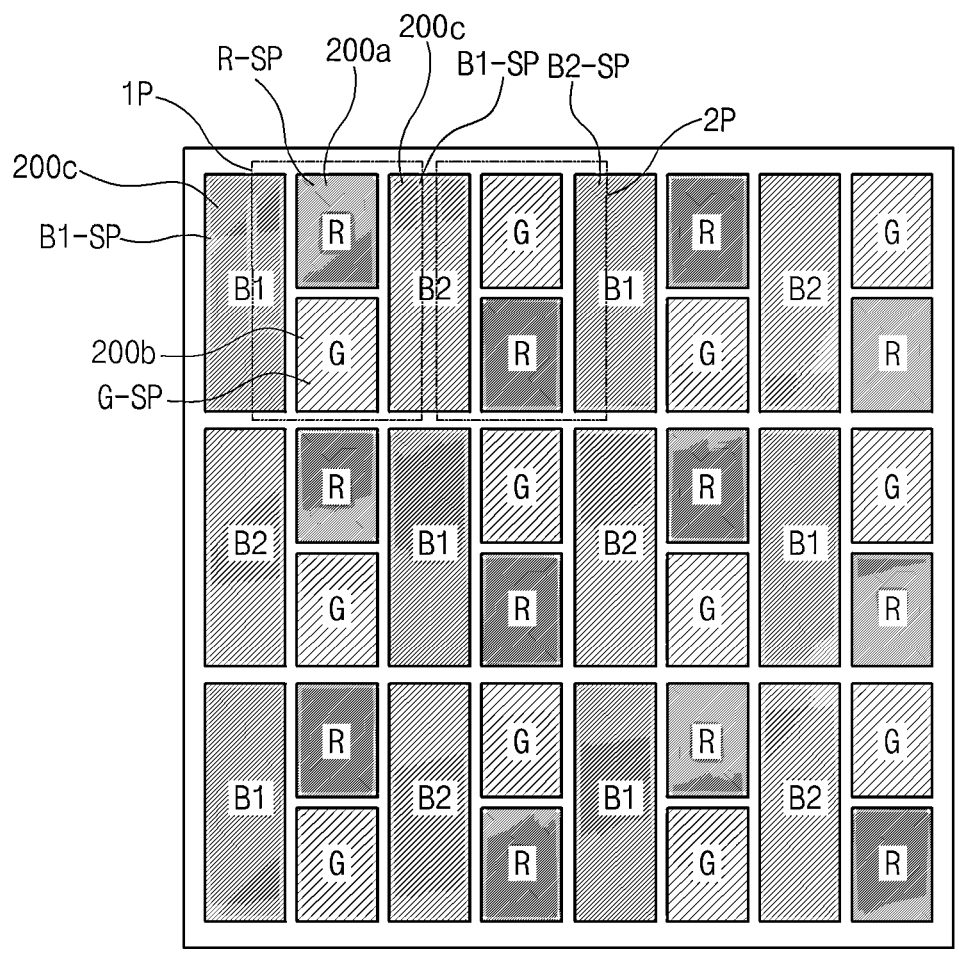
FIG. 3 is a view schematically illustrating a pixel arrangement according to an embodiment of the present invention.

FIG. 3 is a view schematically illustrating a pixel arrangement according to an embodiment of the present invention.

As shown in FIG. 3, a plurality of sub-pixels R-SP, G-SP, B1-SP, and B2-SP, which configure a basic unit for displaying an image, are arranged in a matrix form, and the sub pixels R-SP, G-SP, B1-SP, and B2-SP include red (R), green (G), deep blue (B1), and sky blue (B2) emission material layers 200a, 200b, 200c, and 200d, respectively, to represent red, green, deep blue, and sky blue colors, respectively.

The four sub-pixels R-SP, G-SP, B1-SP, and B2-SP form a pixel (P of FIG. 2).

The R and G sub-pixels R-SP and G-SP are disposed between the B1 sub-pixel B1-SP and the B2 sub-pixel B2-SP. The R and G sub-pixels R-SP and G-SP, which are dot types, are repeatedly disposed in a second direction which is a vertical direction.

That is, the R and G sub-pixels R-SP and G-SP are disposed in the same column, in correspondence to the B1 and B2 sub-pixels B1-SP and B2-SP.

Accordingly, if the R and G sub-pixels R-SP and G-SP are assumed as a sub-pixel R,G-SP, the B1 sub-pixel B1-SP, the R,G sub-pixel R,G-SP, and the B2 sub-pixel B2-SP are arranged in this order, repeatedly, in a first direction.

In each pixel (P of FIG. 2), a B1 sub-pixel B1-SP is disposed, a R,G sub-pixel R,G-SP in which R and G sub-pixels R-SP and G-SP are disposed in the form of dots, is disposed adjacent to one side of the B1 sub-pixel B1-SP, and a B2 sub-pixel B2-SP is disposed adjacent to one side of the R,G sub-pixel R,G-SP. The sub-pixels B1-SP, R,G-SP, and B2-SP are repeatedly arranged in the first direction to form a row, and the row is repeatedly arranged in the first direction.

The B1 sub-pixel B1-SP and the B2 sub-pixel B2-SP are alternately arranged in the second direction which is perpendicular to the first direction. The R sub-pixel R-SP and the G sub-pixel G-SP are alternately arranged in the first direction and in the second direction.

The B1 and B2 sub-pixels B1-SP and B2-SP include the same blue emission material layers to represent blue. However, the B1 sub-pixel B1-SP represents deep blue, whereas the B2 sub-pixel B2-SP represents sky blue.

Accordingly, the OLED display device (100 of FIG. 2) according to the present embodiment can use the B1 and B2 sub-pixels B1-SP and B2-SP complementarily, thereby ensuring a wide color reproduction range while significantly increasing life span and luminous efficiency.

In more detail, blue is closely associated with the color coordinates, color reproduction range, and life span characteristics of the OLED display device 100.

In order to represent deep blue and sky blue using the B1 and B2 sub-pixels B1-SP and B2-SP, a deep blue emission material layer and a sky blue emission material layer have to be deposited in the sub-pixels B1-SP and B2-SP, respectively.

The deep blue emission material layer has an excellent color reproduction range, but has a shorter life span and lower luminous efficiency than the sky blue emission material layer. Meanwhile, the sky blue emission material layer is excellent in view of life span and luminous efficiency, compared to the deep blue organic material, but has a relatively narrow color reproduction range.

Accordingly, the color reproduction range and life span of the OLED display device 100 depend on the emission material layers of the B1 and B2 sub-pixels B1-SP and B2-SP of the OLED display device 100.

In the OLED display device 100, since the B1 sub-pixel B1-SP and the B2 sub-pixel B2-SP are respectively formed in the left and right sides of the R sub-pixel R-SP and the G sub-pixel G-SP, each of the blue sub-pixels, that is, the B1 sub-pixel B1-SP and the B2 sub-pixel B2-SP may be used for either one or the other of neighboring pixels (P of FIG. 2) in the first direction.

The B1 and B2 sub-pixels B1-SP and B2-SP have the same width as the R and G sub-pixels R-SP and G-SP, and double or more the length of the R or G sub-pixels R-SP or G-SP.

That is, each of the B1 and B2 sub-pixels B1-SP and B2-SP has two or three times the area of the R or G sub-pixel R-SP or G-SP.

Accordingly, the blue sub-pixels, that is, the B1 and B2 sub-pixels B1-SP and B2-SP may be used through rendering between neighboring pixels (P of FIG. 2) in the first direction.

In other words, a B1 sub-pixel B1-SP may form a first pixel P1, together with R and G sub-pixels R-SP and G-SP and a B2 sub-pixel B2-SP, disposed in the left side of the B1 sub-pixel B1-SP, and also, the B2 sub-pixel B2-SP forming the first pixel P1 may form a second pixel P2, together with the R and G sub-pixels R-SP and G-SP and the B1 sub-pixel B1-SP, disposed in the right side of the B2 sub-pixel B2-SP.

Since the B1 and B2 sub-pixels B1-SP and B2-SP have wider areas (two times or more) than the R and G sub-pixels R-SP and G-SP, a rendering method capable of maintaining color balance between the R, G, B1, and B2 sub-pixels R-SP, G-SP, B1-SP, and B2-SP can be implemented.

As such, since the OLED display device 100 includes a B1 sub-pixel B1-SP that represents deep blue having an excellent color reproduction range, and a B2 sub-pixel B2-SP that represents sky blue having a long life span and excellent luminous efficiency in each pixel, it is possible to ensure a wide color reproduction range while significantly increasing the life span and luminous efficiency of the OLED display device 100.

Also, in the OLED display device 100, the four sub-pixels R-SP, G-SP, B1-SP, and B2-SP can be driven as one pixel without having to increase the area of each pixel. Also, the sub-pixels R-SP, G-SP, B1-SP, and B2-SP can be arranged at regular intervals, while widening the entire area of the sub-pixels R-SP, G-SP, B1-SP, and B2-SP compared to conventional technologies, thereby achieving a high aperture ratio.

Accordingly, it is possible to improve a color reproduction range or to further increase resolution.

Although the entire area of the sub-pixels R-SP, G-SP, B1-SP, and B2-SP is the same as in the conventional technologies, the area of each pixel can be reduced compared to that of each pixel in the conventional technologies.

That is, in the OLED display device 100, by forming B1 and B2 sub-pixels B1-SP and B2-SP with the same blue organic material, and implementing a microcavity effect in one of the B1 and B2 sub-pixels B1-SP and B2-SP, or different microcavity effects in the B1 and B2 sub-pixels B1-SP and B2-SP, the B1 sub-pixel B1-SP and the B2 sub-pixel B2-SP represent different blue colors of deep blue and sky blue.

Thereby, process efficiency of the OLED display device 100 can be improved.

First Embodiment

Figure 4:
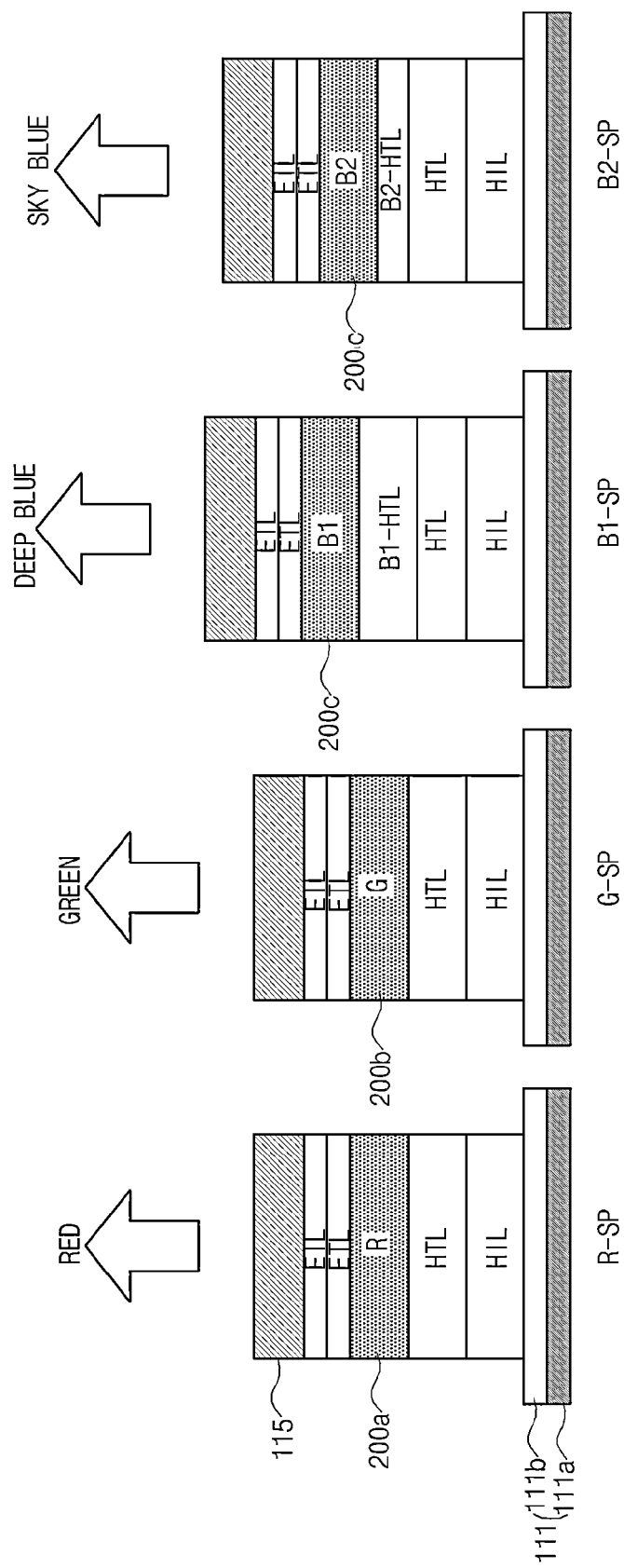
FIG. 4 is a view schematically illustrating the cross-sections of OLED display devices of red (R), green (G), deep blue (B1), and sky blue (B2) sub-pixels, according to a first embodiment of the present invention.

FIG. 4 is a view schematically illustrating the cross-sections of OLED display devices of red (R), green (G), deep blue (B1), and sky blue (B2) sub-pixels R-SP, G-SP, B1-SP, and B2-SP, according to a first embodiment of the present invention.

As shown in FIG. 4, each of the R, G, B1, and B2 sub-pixels R-SP, G-SP, B1-SP, and B2-SP has a stacked structure including a first electrode 111, a hole injection layer (HIL), a hole transport layer (HTL), a R, G, B1, or B2 emission material layer 200a, 200b, or 200c, an electron transport layer (ETL), an electron injection layer (EIL), and a second electrode 115.

The first electrode 111 has a double layer structure of a reflection layer 111a and a transparent layer 111b. The reflection layer 111a may be formed of a metal, such as aluminum (Al), a tantalum (Ta), silver (Ag), etc.

The transparent layer 111b may be preferably formed of a transparent, conductive material, for example, indium tin oxide (ITO) or indium zinc oxide (IZO), having a relatively large work function value, so that the first electrode 111 acts as an anode electrode.

The second electrode 115 is formed of a semi-transmissive, conductive material so that the second electrode 115 acts as a cathode electrode. The second electrode 115 has a double layer structure in which a transparent, conductive material is deposited with a thick thickness on a semi-transparent metal film formed by depositing a metal material with a thin thickness having a lower work function value than the first electrode 111.

The second electrode 115 may be preferably formed of a material selected from aluminum (Al), an aluminum alloy (AlNd), silver (Ag), magnesium (Mg), an aluminum magnesium alloy (AlMg), and a silver magnesium alloy (AgMg).

The hole transport layer HTL of the B1 sub-pixel B-SP further includes a B1 hole transport layer B1-HTL, and the hole transport layer HTL of the B2 sub-pixel B2-SP further includes a B2 hole transport layer B2-HTL.

Although not shown in FIG. 4, only one of the B1 and B2 sub-pixels B1-SP and B2-SP may include an additional hole transport layer HTL, and the other one of the B1 and B2 sub-pixels B1-SP and B2-SP may include no hole transport layer HTL.

Accordingly, the hole transport layers HTL, B1-HTL, and B2-HTL of the B1 and B2 sub-pixels B1-SP and B2-SP have different thicknesses, so that the B1 and B2 sub-pixels B1-SP and B2-SP can implement the microcavity effect.

The microcavity effect is a phenomenon in which light reflected between mirrors is cancelled or constructively interfered with each other so that only a specific wavelength of light remains and the remaining wavelengths of light are cancelled to weaken light intensity. The microcavity effect increases a specific wavelength.

The microcavity effect can implement various spectrums depending on the distance between mirrors and the distance between the mirror and an emission material layer (for example, 200c).

Accordingly, in the OLED display device 100, by depositing the same blue organic material in the B1 and B2 sub-pixels B1-SP and B2-SP and then differentiating the thicknesses of the hole transport layers HTL, B1-HTL, and B2-HTL of the B1 and B2 sub-pixels B1-SP and B2-SP to implement different microcavity effects in the B1 and B2 sub-pixels B1-SP and B2-SP, it is possible to represent different blue colors.

As such, in the OLED display device 100, the same blue organic material is deposited in the B1 and B2 sub-pixels B1-SP and B2-SP, then a B1 hole transport layer B1-HTL is additionally formed in the B1 sub-pixel B1-SP, and a B2 hole transport layer B2-HTL is additionally formed in the B2 sub-pixel B2-SP. Accordingly, the thicknesses of the hole transport layers HTL, B1-HTL, and B2-HTL of the B1 and B2 sub-pixels B1-SP and B2-SP become different to implement different microcavity effects in the B1 and B2 sub-pixels B1-SP and B2-SP, thereby representing different blue colors.

At this time, a microcavity effect capable of representing deep blue is implemented in the B1 sub-pixel B1-SP, and a microcavity effect capable of representing sky blue is implemented in the B2 sub-pixel B2-SP.

Figure 5:
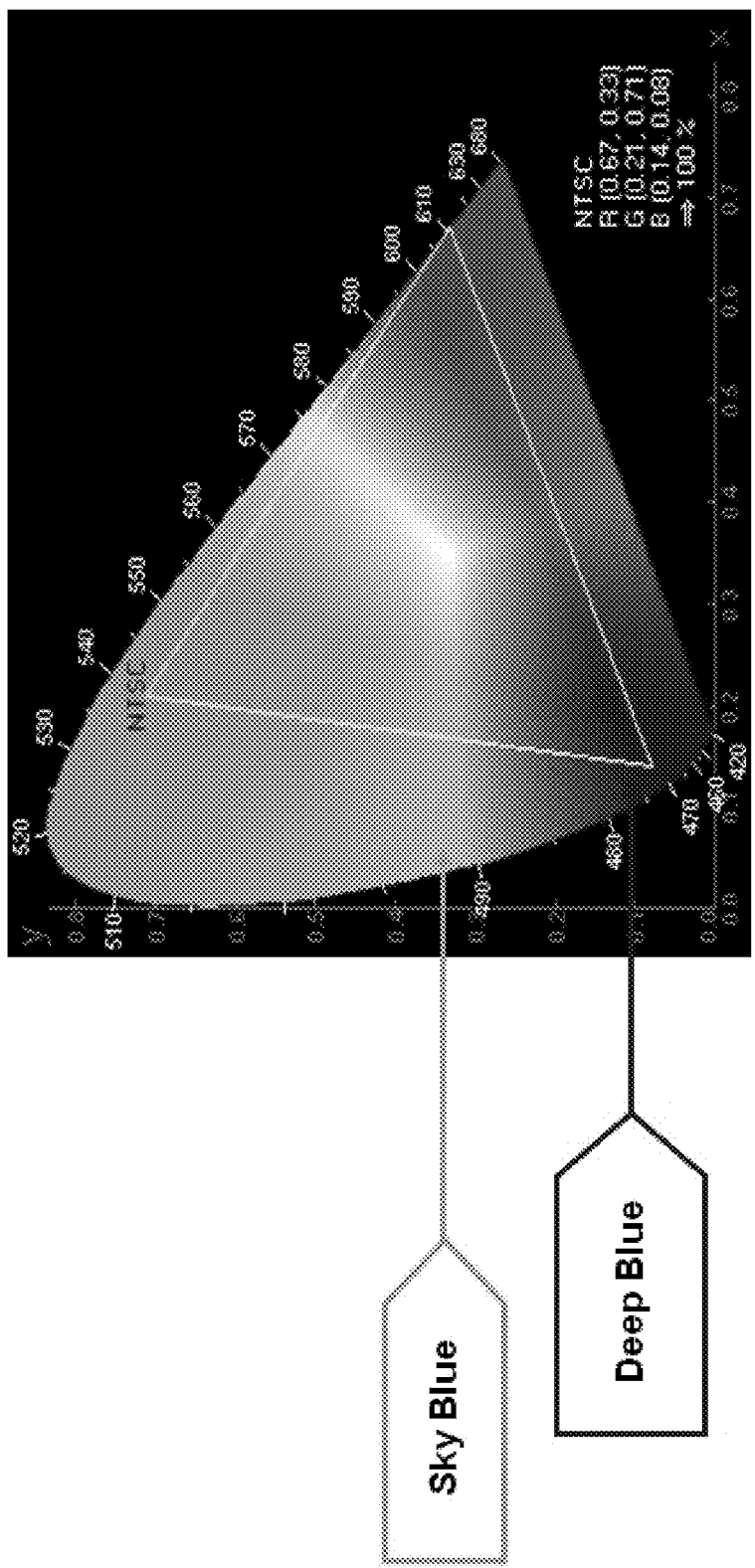
FIG. 5 is a graph showing color coordinates of an OLED display device.

The following Table 1 shows the measurement results of color coordinates according to the thickness of the hole transport layer HTL of an organic light-emitting diode (E of FIG. 3) including the blue emission material layer 200c formed of the same blue organic material, and FIG. 5 is a graph showing the color coordinates of the OLED display device 100.

TABLE 1

| Blue | Thickness | CIEx | CIEy |
|---|---|---|---|
| Hole Transport Layers | 1150 | 0.1283 | 0.1194 |
| (HTL, B1-HTL, B2-HTL) | 1250 | 0.1153 | 0.1452 |
| | 1350 | 0.1060 | 0.2038 |
| | 1450 | 0.0990 | 0.3680 |
| | 1550 | 0.1172 | 0.5045 |
| | 1650 | 0.1550 | 0.5807 |

Referring to Table 1 and FIG. 5, it is seen that color coordinates change according to the thickness of the hole transport layers HTL, B1-HTL and B2-HTL, and the color coordinates represent sky blue as the thickness of the hole transport layers HTL, B1-HTL, and B2-HTL become thicker.

That is, in the OLED display device 100, by forming B1 and B2 sub-pixels B1-SP and B2-SP with the same blue organic material and then differentiating the thicknesses of hole transport layers HTL, B1-HTL, and B2-HTL, different microcavity effects are implemented so that the B1 sub-pixel B1-SP represents deep blue and the B2 sub-pixel B2-SP represents sky blue.

Accordingly, the process efficiency of the OLED display device 100 can be improved.

That is, in the first embodiment, by differentiating the thicknesses of the hole transport layers HTL, B1-HTL, and B2-HTL, different microcavity effects are implemented in the B1 sub-pixel B1-SP and the B2 sub-pixel B2-SP. However, it is also possible to implement different microcavity effects in the B1 and B2 sub-pixels B1-SP and B2-SP by adjusting the thicknesses of the hole injection layers HIL, the electron transport layers ETL, the electron injection layers EIL, and the first and second electrodes 111 and 115, other than the hole transport layers HTL, B1-HTL, and B2-HTL.

Likewise, by implementing the microcavity effect in the R and G sub-pixels R-SP and G-SP, it is possible to prevent luminous efficiency from changing according to the properties of organic materials that represent different colors, while improving optical efficiency.

Second Embodiment

Figure 6:
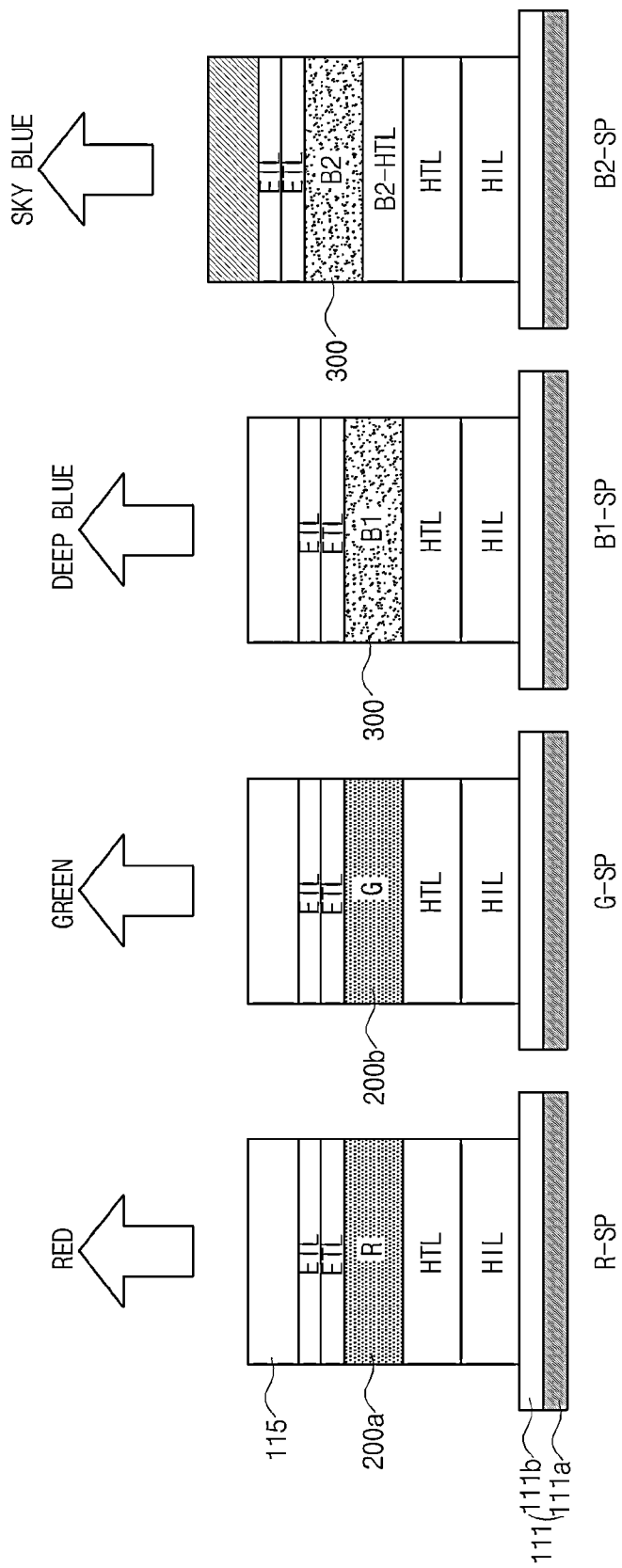
FIG. 6 is a view schematically illustrating the cross-sections of OLED display devices of red (R), green (G), deep blue (B1), and sky blue (B2) sub-pixels, according to a second embodiment of the present invention.

FIG. 6 is a view schematically illustrating the cross-sections of OLED display devices of red (R), green (G), deep blue (B1), and sky blue (B2) sub-pixels, according to a second embodiment of the present invention.

As shown in FIG. 6, each of the R, G, B1, and B2 sub-pixels R-SP, G-SP, B1-SP, and B2-SP has a stacked structure including a first electrode 111, a hole injection layer (HIL), a hole transport layer (HTL), a R, G, B1, or B2 emission material layer 200a, 200b, or 300, an electron transport layer (ETL), an electron injection layer (EIL), and a second electrode 115.

The first electrode 111 has a double layer structure of a reflection layer 111a and a transparent layer 111b. The reflection layer 111a may be formed of a metal, such as aluminum (Al), a tantalum (Ta), silver (Ag), etc.

The transparent layer 111b may be preferably formed of a transparent, conductive material, for example, indium tin oxide (ITO) or indium zinc oxide (IZO), having a relatively large work function value, so that the first electrode 111 acts as an anode electrode.

The second electrodes 115 of the R, G, and B1 sub-pixels R-SP, G-SP, and B1-SP are formed of a transparent material, and the second electrode 115 of the B2 sub-pixel B2-SP is formed of a semi-transparent material.

Each second electrode 115 may preferably have a double layer structure in which a transparent, conductive material is deposited with a thick thickness on a semi-transparent metal film formed by depositing a metal material with a thin thickness having a lower work function value than the first electrode 111. By making the thicknesses of the semi-transparent metal layers of the second electrodes 115 of the R, G, and B1 sub-pixels R-SP, G-SP, and B1-SP different from the thickness of the semi-transparent metal layer of the second electrode 115 of the B2 sub-pixel B2-SP, the second electrodes 115 of the R, G, and B1 sub-pixels R-SP, G-SP, and B1-SP are formed to be transparent, and the second electrode 115 of the B2 sub-pixel B2-SP is formed to be semi-transparent.

The second electrode 115 may be preferably formed of a material selected from aluminum (Al), an aluminum alloy (AlNd), silver (Ag), magnesium (Mg), an aluminum magnesium alloy (AlMg), and a silver magnesium alloy (AgMg).

Accordingly, the B2 sub-pixel B2-SP can implement a microcavity effect.

A microcavity effect is a phenomenon in which light reflected between mirrors is cancelled or constructively interfered with each other so that only a specific wavelength of light remains, and the remaining wavelengths of light are cancelled to weaken light intensity. The microcavity effect increases a specific wavelength.

The microcavity effect can implement various spectrums depending on the distance between mirrors and the distance between the mirror and an emission material layer (for example, 300).

Accordingly, in the OLED display device 100, by implementing the microcavity effect only in the B2 sub-pixel B2-SP, the blue organic material in the B2 sub-pixel B2-SP represents sky blue by the microcavity effect although the same blue organic material is deposited in the B1 and B2 sub-pixel B1-SP and B2-SP.

The blue organic material deposited in the B1 and B2 sub-pixels B1-SP and B2-SP has color coordinates of CIEx 0.20 and CIEy 0.44, and represents a little dark blue, nearly, deep blue. The blue organic material is a high efficiency blue organic material having luminous efficiency of 21 cd/A and a life span of 17,500 hr@200 cd/m2.

Figure 7:
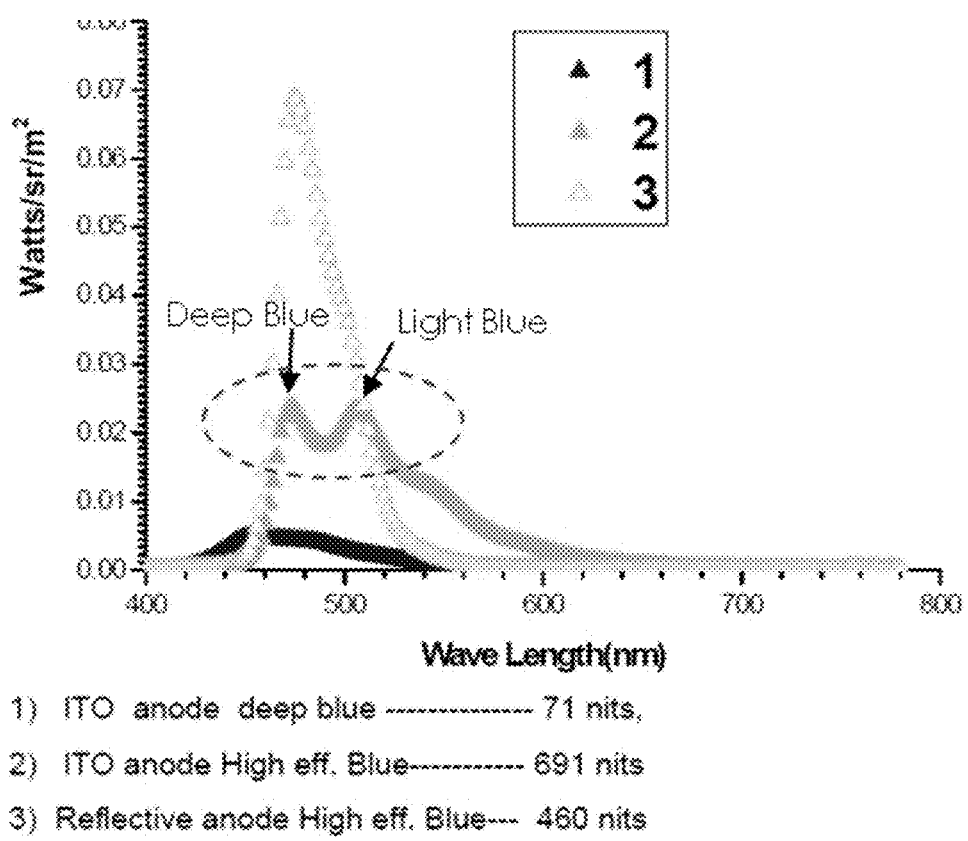
FIG. 7 is data showing that a sky blue peak is extracted from a high efficiency blue organic material by a microcavity effect.

Representing sky blue using the blue organic material can be shown in FIG. 7.

Referring to FIG. 7, a general deep blue organic material has a brightness of 71 nits, and the high efficiency blue organic material has a brightness of 691 nits and has both a deep blue peak and a light blue peak.

A sky blue peak having a brightness of 460 nits can be extracted from the high efficiency blue organic material by the microcavity effect.

The sky blue peak extracted from the high efficiency blue organic material has color coordinates of CIEx 0.10 and CIEy 0.23, luminous efficiency of 20 cd/A, and a life span of 100,000 hr@200 cd/m².

Meanwhile, the example of FIG. 6 corresponds to the case where the B2 sub-pixel B2-SP further includes a B2 hole transport layer B2-HTL, however, the B2 sub-pixel B2-SP may include no B2 hole transport layer B2-HTL.

Since the high efficiency blue organic material can extract a sky blue peak by implementing the microcavity effect, the distance between the electrodes 111 and 115, the distances between the electrodes 111 and 115 and the emission material layer 300, the content of dopant included in the emission material layer 300, etc. for implementing the microcavity effect are not limited.

As described above, in the OLED display device 100 according to the second embodiment, when the B1 sub-pixel B1-SP that represents deep blue and the B2 sub-pixel B2-SP that represents sky blue are formed, by using a high efficiency blue organic material to form the same emission material layers 300 in both the B1 and B2 sub-pixels B1-SP and B2-SP such that a microcavity effect is implemented only in the B2 sub-pixel B2-SP and a sky blue peak can be extracted from the high efficiency blue organic material of the B2 sub-pixel B2-SP, the emission material layer 300 of the B2 sub-pixel B2-SP can represent sky blue.

Accordingly, it is possible to improve process efficiency of the OLED display device 100.

In more detail, generally, since an emission material layer requires a separate vacuum thermal evaporation operation for each color, at least four vacuum thermal evaporation operations need to be performed if a pixel is composed of four sub-pixels to represent four different colors.

That is, a red organic material is deposited on a substrate in an R sub-pixel, a green organic material is deposited in a G sub-pixel on the substrate on which the red organic material has been deposited, a deep blue organic material is deposited in a B1 sub-pixel, and a sky blue organic material is deposited in a B2 sub-pixel on the substrate on which the deep blue organic material has been deposited.

In contrast, in the OLED display device 100, instead of separately depositing a deep blue organic material and a sky blue organic material, only a high efficiency blue organic material is deposited in both B1 and B2 sub-pixels B1-SP and B2-SP such that sky blue is represented in the B2 sub-pixel B2-SP by the microcavity effect, a process of depositing the emission material layers 200a, 200b, and 300 can be simplified, which leads to a short process time and a reduction of the cost of materials, resulting in improvement in process efficiency of the OLED display device 100.

Meanwhile, in the second embodiment, only the B2 sub-pixel B2-SP implements the microcavity effect, however, the R and G sub-pixels R-SP and G-SP can also implement the microcavity effect, thereby preventing differences between luminous efficiencies according to the properties of organic materials representing different colors, while improving optical efficiency.

It will be apparent to those skilled in the art that various modifications and variations can be made in a display device of the present disclosure without departing from the sprit or scope of the invention. Thus, it is intended that the present invention covers the modifications and variations of this invention provided they come within the scope of the appended claims and their equivalents.

What is claimed is:

1. An organic light-emitting diode (OLED) display device in which a red sub-pixel, a green sub-pixel, a deep blue sub-pixel, and a sky blue sub-pixel form a pixel, comprising:
   an organic light-emitting layer in which the red sub-pixel includes a red light-emitting material layer, the green sub-pixel includes a green light-emitting layer, and the deep blue sub-pixel and the sky blue sub-pixel include the same blue light-emitting material layers; and
   an organic light-emitting diode including a first electrode and a second electrode for each sub-pixel,
   wherein the first electrode of the sky blue sub-pixel includes a reflection layer, the second electrode of the sky blue sub-pixel is semi-transparent, and the sky blue sub-pixel represents sky blue through a microcavity effect.

2. The OLED display device according to claim 1, wherein the blue light-emitting material layer has a deep blue peak and a light blue peak, and a sky blue peak is extracted from the blue light-emitting material layer by the microcavity effect.

3. The OLED display device according to claim 1, wherein the microcavity effect is implemented due to the blue light-emitting material layers or peripheral layers of the sky blue sub-pixel having different thickness combinations from the red sub-pixel, the green sub-pixel, and the deep blue sub-pixel.

4. The OLED display device according to claim 3, wherein the peripheral layers comprise a hole transport layer and a hole injection layer between the blue light-emitting material layer and the first electrode, and an electron transport layer and an electron injection layer between the blue light-emitting material layer and the second electrode.

5. The OLED display device according to claim 1, wherein the first electrodes of the red sub-pixel and the green sub-pixel comprise reflection layers, and the second electrodes are semi-transparent.

6. The OLED display device according to claim 1, wherein the deep blue sub-pixel or the sky blue sub-pixel have two or three times the areas of the red sub-pixel and the green sub-pixels.

* * * * *